US009799540B2

(12) United States Patent
Oono

(10) Patent No.: US 9,799,540 B2
(45) Date of Patent: Oct. 24, 2017

(54) LIQUID PROCESSING APPARATUS, LIQUID PROCESSING METHOD AND STORAGE MEDIUM

(71) Applicant: Tokyo Electron Limited, Tokyo (JP)

(72) Inventor: Shigemi Oono, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 191 days.

(21) Appl. No.: 13/755,304

(22) Filed: Jan. 31, 2013

(65) Prior Publication Data

US 2013/0206726 A1 Aug. 15, 2013

(30) Foreign Application Priority Data

Feb. 14, 2012 (JP) .................................. 2012-029598

(51) Int. Cl.
*H01L 21/67* (2006.01)

(52) U.S. Cl.
CPC .... *H01L 21/6708* (2013.01); *H01L 21/67253* (2013.01); *H01L 21/67259* (2013.01)

(58) Field of Classification Search
USPC .......................... 156/345.24, 345.15, 345.25
See application file for complete search history.

(56) References Cited

U.S. PATENT DOCUMENTS 7,128,803 B2 * 10/2006 Owczarz et al. ......... 156/345.13
7,366,344 B2 * 4/2008 Sim ............................... 382/149
7,530,749 B2 * 5/2009 Yamamoto et al. ............ 396/611
7,632,358 B2 * 12/2009 Iwase et al. ..................... 134/18
7,959,988 B2 * 6/2011 Yamamoto et al. ........... 427/595
2005/0087298 A1 * 4/2005 Tanaka et al. ............ 156/345.24
2005/0150451 A1 7/2005 Tanaka et al.
2010/0033706 A1 * 2/2010 Shindo .............. H01L 21/67259
355/74
2010/0073647 A1 * 3/2010 Kyouda et al. ................. 355/30
2013/0206726 A1 * 8/2013 Oono ............................. 216/85

FOREIGN PATENT DOCUMENTS

| JP | 07-142339 A | 6/1995 |
|---|---|---|
| JP | 2003-197600 A | 7/2003 |
| JP | 2003-273063 A | 9/2003 |
| JP | 2005-203440 A | 7/2005 |
| JP | 2006-140385 A | 6/2006 |
| JP | 2006-237063 A | 9/2006 |
| JP | 2007-142077 A | 6/2007 |
| JP | 2008-244328 A | 10/2008 |
| JP | 2009-147152 A | 7/2009 |

* cited by examiner

*Primary Examiner* — Sylvia R MacArthur
(74) *Attorney, Agent, or Firm* — Abelman, Frayne & Schwab

(57) ABSTRACT

A substrate holding unit of a liquid processing apparatus holds a circular substrate horizontally and rotates the substrate about a vertical axis, and a chemical liquid nozzle supplies a chemical liquid to the peripheral edge of the substrate while the substrate is being rotated in order to remove a film of the peripheral edge. An image capture unit captures an image of the peripheral edge, and a determination unit calculates an actually removed value for a removed width of the film based on a result of the image capturing and determines whether the removed width is suitable or not.

4 Claims, 10 Drawing Sheets

LIQUID PROCESSING APPARATUS, LIQUID PROCESSING METHOD AND STORAGE MEDIUM

CROSS-REFERENCE TO RELATED APPLICATIONS

This application is based on and claims priority from Japanese Patent Application No. 2012-029598, filed on Feb. 14, 2012, with the Japanese Patent Office, the disclosure of which is incorporated herein in its entirety by reference.

TECHNICAL FIELD

The present disclosure relates to a technology of supplying a chemical liquid to a peripheral edge of a substrate to remove a film of the peripheral edge.

BACKGROUND

A single wafer type liquid processing apparatus has been used in a semiconductor device manufacturing process. The liquid processing apparatus holds a substrate, i.e., a semiconductor wafer ("wafer") horizontally and supplies various chemical liquids to the peripheral edge of the wafer while rotating the wafer about a vertical axis, thereby removing, for example, a resist film, pollutant, or an oxidation film attached to the peripheral edge of the wafer.

As an example, Japanese Laid-Open Publication No. 2007-142007 discloses a technology of etching a film of the peripheral edge of a substrate (paragraphs [0033] to [0036] and [0057], and FIG. 8A). The technology arranges a disc-shaped shielding plate to be opposed to a substrate to be processed so as to shield the substrate from the external atmosphere, and supplies a chemical liquid toward the substrate from a peripheral edge processing nozzle installed on the peripheral edge of the shielding plate while the substrate is being rotated, thereby etching a thin film at the peripheral edge of the substrate. However, Japanese Laid-Open Publication No. 2007-142007 does not disclose a technology of confirming whether the chemical liquid supplied from the peripheral edge processing nozzle is supplied to a desired position on the peripheral edge of the substrate or not.

SUMMARY

A liquid processing apparatus according to the present disclosure includes: a substrate holding unit configured to hold a circular substrate horizontally and to rotate the substrate about a vertical axis; a chemical liquid nozzle configured to supply a chemical liquid to a peripheral edge of the substrate rotated by the substrate holding unit in order to remove a film of the peripheral edge; an image capture unit configured to capture an image of the peripheral edge; and a determination unit configured to calculate an actually removed value of a removed width of the film based on the image captured by the image capture unit, and to determine whether the actually removed value of the removed width is suitable or not.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
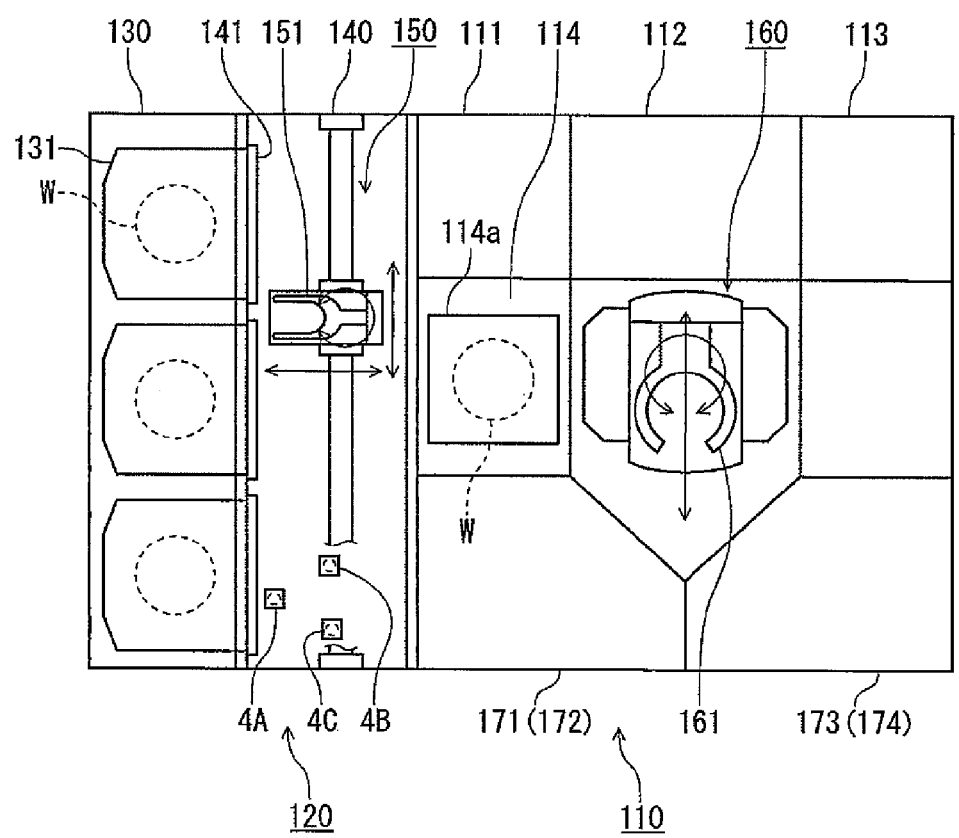
FIG. 1 is a top plan view of a wafer processing system according to an exemplary embodiment.

In the following detailed description, reference is made to the accompanying drawing, which form a part hereof. The illustrative exemplary embodiments described in the detailed description, drawings, and claims are not intended to limit. Other embodiments may be utilized, and other changes may be made, without departing from the spirit or scope of the subject matter presented here.

The present disclosure is made in an effort to solve the problems in the related art, and an aspect of the disclosure provides a liquid processing apparatus and a liquid processing method capable of confirming a removed width of a film of a peripheral edge of a substrate, and determining whether the removed width is suitable or not. Also, another aspect of the present disclosure provides a computer-readable storage medium that stores a program for performing the liquid processing method.

A liquid processing apparatus according to the present disclosure includes: a substrate holding unit configured to hold a circular substrate horizontally and to rotate the substrate about a vertical axis; a chemical liquid nozzle configured to supply a chemical liquid to a peripheral edge of the substrate rotated by the substrate holding unit in order to remove a film on the peripheral edge; an image capture unit configured to capture an image of the peripheral edge; and a determination unit configured to calculate an actually removed value of a removed width of the film based on the image captured by the image capture unit, and to determine whether the actually removed value of the removed width is suitable or not.

The above-described liquid processing apparatus may have the following features.

(a) The above-described liquid processing apparatus further includes: a moving mechanism configured to move the chemical liquid nozzle; and a nozzle controller configured to output a control signal to the moving mechanism configured to move the chemical liquid nozzle. When the determination unit determines that the difference between a set value for width to be removed and the average value of the actually removed values exceeds a predetermined permissible difference, the moving mechanism receives the control signal from the nozzle controller and moves the chemical liquid nozzle to a position where the difference becomes smaller than the permissible difference.

(b) In the above-described liquid processing apparatus, the image capture unit captures images of a plurality of image capture areas existing on the peripheral edge of the substrate, and the determination unit compares the average value of actually removed values for the removed width at the plurality of image capture areas with the set value for the width to be removed.

(c) The above-described liquid processing apparatus further includes: a positioning mechanism configured to move the substrate on the substrate holding unit to determine a position to hold the substrate; and a positioning controller configured to output a control signal to the positioning mechanism in order to align the center of the substrate with the center of rotation, wherein the image capture unit captures images of a plurality of image capture areas existing on the peripheral edge of substrate, the determination unit compares each of actually removed values for the removed width at the plurality of image capture areas with a set value for a width to be removed, and when the determination unit determines that the difference between the set value and any of the actually removed values for the removed width exceeds a first predetermined permissible difference, the positioning mechanism receives the control signal from the positioning controller and moves the substrate to a position where the difference between the set value and the corresponding actually removed value becomes smaller than the first permissible difference.

(d) In the above-described liquid processing apparatus, the determination unit compares each of actually removed values for the removed width at the plurality of image capture areas with the average value of the actually removed values, and, when the determination unit determines that the difference between any of the actually removed values for the removed width and the average value of the actually removed values exceeds a second predetermined permissible difference, the positioning mechanism receives the control signal from the positioning controller and moves the substrate to a position where the difference between the corresponding actually removed value for the removed width and the average value of the actually removed values becomes smaller than the second permissible difference.

(e) In the above-described liquid processing apparatus, the image capture unit is installed on a transportation path between a carrier that accommodates a wafer to be processed and the substrate holding unit.

(f) The above-described liquid processing apparatus further includes a substrate processing unit configured to perform a processing of the substrate. The substrate holding unit, the chemical liquid nozzle and the image capture unit are accommodated in the substrate processing unit.

Another aspect of the present disclosure provides a liquid processing method including: holding a circular substrate horizontally, and rotating the substrate about a vertical axis by a substrate holding unit; supplying a chemical liquid to the peripheral edge of the substrate rotated by the substrate holding unit in order to remove a film of the peripheral edge of the substrate; capturing an image of the peripheral edge after the film of the peripheral edge of the substrate is removed; calculating an actually removed value for the removed width of the film based on an image obtained by capturing an image of the peripheral edge; and determining whether the chemical liquid supplying position is suitable or not based on the actually removed value for the removed width.

In the above-described liquid processing method, in the capturing step, images of a plurality of image capture areas existing on the peripheral edge are captured, and in the determining step, the average value of actually removed values for the removed width at the plurality of image capture areas and a set value for a width to be removed are compared with each other.

In the above-described liquid processing method, when it is determined that the difference between the set value and the average value of the actually removed values exceeds a predetermined permissible difference in the determining step, the liquid processing method includes moving the supplying position of the chemical liquid to a position where the difference becomes smaller than the permissible difference.

In the above-described liquid processing method, when it is determined that the difference between the set value and the actually removed value for the removed width exceeds a first predetermined permissible difference in the determining step, the liquid processing method includes moving the substrate in a direction where the center of the substrate on the substrate holding unit is aligned with the center of rotation such that the difference between the set value and the actually removed value becomes smaller than the first permissible difference.

In the above-described liquid processing method, in the capturing step, images of a plurality of image capture areas existing on the peripheral edge are captured, in the determining step, each of actually removed values for the removed width at the plurality of image capture areas is compared with the average value of the actually removed values, and in the step of moving the substrate in the direction where the center of the substrate on the substrate holding unit is aligned with the center of rotation, and the difference between each of the actually removed values for the removed width and the average value of the actually removed values is set as a second difference, and when the second difference exceeds the predetermined second permissible difference, the substrate is moved such that the difference between the corresponding actually removed value for the removed width and the average value of the actually removed values becomes smaller than the second permissible difference.

Yet another aspect of the present disclosure provides a non-transitory computer-readable storage medium storing a computer program that, when executed, causes to perform a liquid processing method, the computer program being used in a liquid processing apparatus that holds a circular substrate horizontally to rotate the substrate about a vertical axis, and, while the substrate is being rotated, supplies a chemical liquid to the peripheral edge of the substrate to remove a film. The steps to execute the liquid processing method as set forth in claim 8 are provided in the computer program.

According to the present disclosure, it may be determined whether a removed width of a film of the peripheral edge of a substrate is suitable or not based on an image captured from the peripheral edge of the liquid processed substrate.

Descriptions will be made as to a configuration of a wafer processing apparatus with reference to FIGS. 1 to 5. The wafer processing apparatus is an exemplary embodiment of a liquid processing apparatus of the present disclosure. The wafer processing apparatus in the present embodiment is provided in the wafer processing system. As illustrated in the plan view of FIG. 1 and the side view of FIG. 2, the wafer processing apparatus of the present exemplary embodiment includes: a substrate processing unit 110; an FOUP (Front Opening Unified Pod) 131 which is a carrier transferred from the outside, and is capable of accommodating a plurality of wafers, for example, 25 wafers; and a carry-in/carry-out unit 120 that performs the carry-in/carry-out of a wafer W between FOUP 131 and substrate processing unit 110.

Carry-in/carry-out unit 120 is provided with a placement table 130 on which, for example, three FOUPs 131 may be placed, and a transportation chamber 140 configured to perform the transportation of wafer W between FOUP 131 placed on placement table 130 and substrate processing unit 110. A shutter 141 removes a cover of FOUP 131 such that FOUP 131 and transportation chamber 140 are communicated with each other.

In the inside of transportation chamber 140, a first wafer transportation mechanism 150 is provided to perform the transportation of wafer W between FOUP 131 and a wafer transfer unit 114 in substrate processing unit 110. First wafer transportation mechanism 150 is provided with, for example, two picks 151. Each pick 151 is configured to be capable of performing all the actions of moving in the FOUPs 131 arranged direction, reciprocating, lifting, lowering, and rotating. Wafer W is held on each pick 151 to be transported. In addition, an FFU (Fan Filter Unit) 152 develops down-flow of clean air in the inside of transportation chamber 140.

Substrate processing unit 110 includes: wafer transfer unit 114 including a placement shelf 114a, on which wafer W to be transported between substrate processing unit 110 and transportation chamber 140 is temporarily placed; wafer processing units 171, 172, 173, 174, in which a liquid processing for wafer W is performed; and a second wafer transportation mechanism 160 that performs the transportation of wafer W in substrate processing unit 110. Second wafer transportation mechanism 160 includes a pick 161 configured to be capable of performing all the actions of reciprocating, lifting, lowering, and rotating, and wafer is retained on pick 161 to be transported.

The wafer processing apparatus of the present exemplary embodiment is assembled to each of wafer processing units 171, 172, 173, 174. As illustrated in FIG. 1, the wafer processing system further includes: a processing liquid storage unit 111 configured to store a processing liquid used in the wafer processing apparatus (e.g., a chemical liquid or a rinse liquid); a power supply unit 112 configured to supply power to the entirety of the substrate processing system; and a control unit 113 that accommodates a controller 5 configured to perform the control of the entirety of the substrate processing system. Controller 5 will be described later. In addition, an FFU 116 illustrated in FIG. 2 develops down-flow of clean air in a space where wafer processing units 171, 172, 173, 174 and second wafer transportation mechanism 160 are installed.

Next, the wafer processing apparatus installed in each of wafer processing units 171, 172, 173, 174 will be described with reference to FIGS. 3 to 5. The wafer processing apparatus of the present exemplary embodiment removes an unnecessary film, such as for example, an $SiO_2$ film, an SiN film, and a polysilicon film, formed on the peripheral edge of wafer W, more specifically, at a bevel portion formed by chamfering the peripheral edge of wafer W, using an etching processing liquid which is a chemical liquid.

Figure 3:
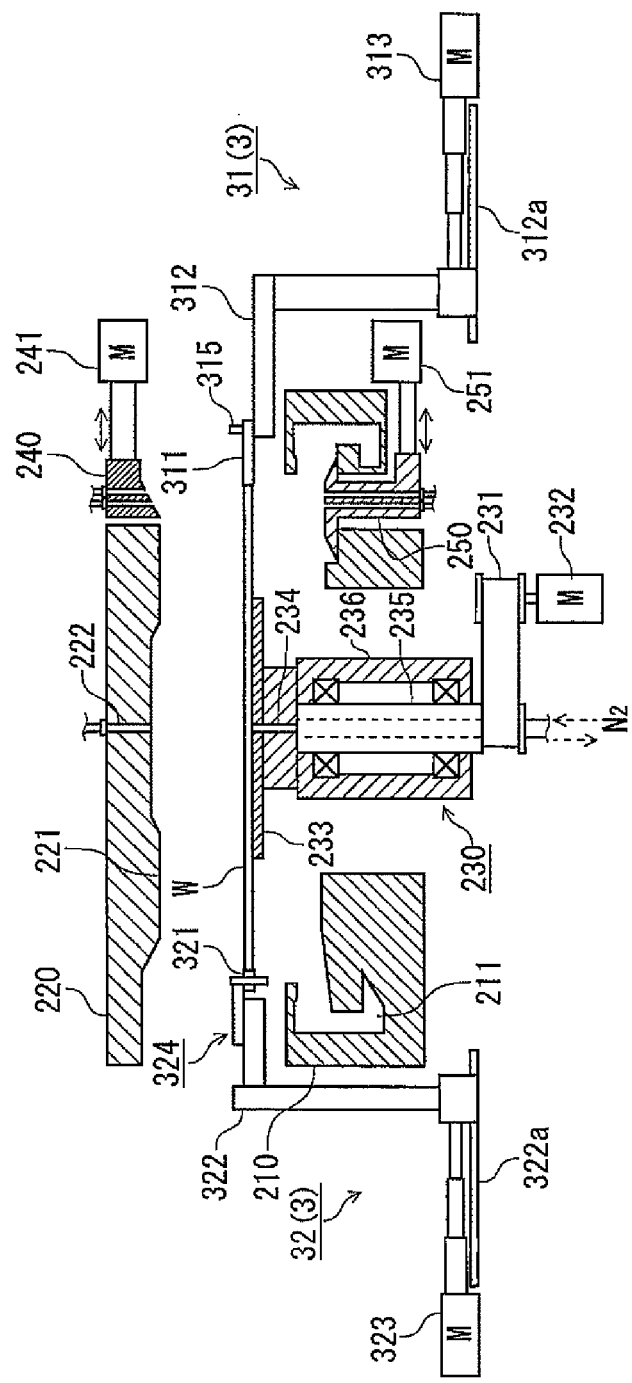
FIG. 3 is a longitudinal cross-sectional view of a wafer processing apparatus provided in the wafer processing system.

As illustrated in FIG. 3, the wafer processing apparatus is provided with a wafer holding unit 230 (a substrate holding unit) configured to hold wafer W horizontally and to rotate wafer W about a vertical axis, a drain cup 210 configured to receive the processing liquid that is supplied to rotating wafer W and scattered to the surrounding, and to discharge the received processing liquid to the outside, a top plate 220 configured to cover the top side of wafer W, and first and second nozzles 240, 250 configured to supply the processing liquid from the top side and bottom side of the bevel portion of wafer W, respectively.

Wafer holding unit 230 is configured in such a manner that a circular vacuum chuck unit 233 is installed on the top end of a rotation shaft 235 that is connected to a motor 232 through a power transmission unit 231 formed by, for example, a pulley and a belt. Rotation shaft 235 is configured to extend vertically and to be rotatable about the central axis thereof. As illustrated in FIG. 3, rotation shaft 235 is retained by a bearing 236.

Vacuum chuck unit 233 and rotation shaft 235 are provided with a gas flow path 234. One end of gas flow path 234 is opened on the top of vacuum chuck unit 233, and the other end is switchably connected to a vacuum pump and a nitrogen gas supply unit which are not illustrated in the drawings. When performing a processing of wafer W, the inside of gas flow path 234 may be evacuated by the vacuum pump to adsorptively hold wafer W on vacuum chuck unit 233. In addition, wafer W on vacuum chuck unit 233 may be floated by stopping the evacuation and supplying nitrogen ($N_2$) gas into gas flow path 234.

Top plate 220 is a disc-shaped member that covers the top side of wafer W held on wafer holding unit 230, and an annular protrusion 221 is formed on the bottom side thereof so as to narrow the flow path of gas. At the central area, top plate 220 is provided with a gas supply line 222 configured to supply clean air or nitrogen gas. As a result, it is possible to form gas stream that flows from the central area side to the peripheral edge side of wafer W, and to suppress the mists or vapors of the processing liquid supplied to the bevel portion from entering the central area side of wafer W.

Top plate 220 is cut out at a part of the peripheral edge of the disc shape, and a first nozzle 240 is arranged in the inside of the cut-out portion. First nozzle 240 is configured to supply a processing liquid to the bevel portion of wafer W from the upper side. First nozzle 240 may switchably supply a plurality of processing liquids, such as for example, an etching processing liquid or a rinse liquid. From a viewpoint that the etching liquid, which is a chemical liquid, is supplied to the bevel portion of wafer W, first nozzle 240 corresponds to a chemical liquid nozzle of the present exemplary embodiment.

First nozzle 240 is provided with a moving mechanism 241 that includes a rod or a cylinder motor to move first nozzle 240 in the diametric direction of top plate 220, i.e., in the diametric direction of wafer W. Moving mechanism 241 serves to move first nozzle 240 based on a result of measuring the diameter of wafer W by a positioning mechanism 3 such that first nozzle 240 supplies the processing liquid at a position spaced away from the peripheral edge of wafer W toward the center of wafer W by a predetermined distance. Positioning mechanism 3 will be described later.

Drain cup 210 is an annular member arranged to surround wafer W held on wafer holding unit 230, and a recess 211 is formed along the inner circumferential surface thereof to receive the processing liquid shaken away from wafer W. A drainage tube and an exhaust tube not illustrated in the drawing are connected to recess 211, such that the processing liquid received in drain cup 210 or gas flown into recess 211 from the top side of wafer W can be discharged to the outside.

A cut-out portion is formed at an area more inside than recess 211 of drain cup 210 to arrange a second nozzle 250 that is configured to supply a processing liquid to the bevel portion of wafer W from the bottom side. Considering that a plurality of processing liquids, such as for example, an etching processing liquid and a rinse liquid, are capable of being switchingly supplied, and moving mechanism 251 is provided to adjust a processing liquid supplying position to a position spaced away from the peripheral edge toward the center of wafer W by a predetermined distance, second nozzle 250 has a function in common with first nozzle 240. From the viewpoint that the etching processing liquid, which is a chemical liquid, is supplied to the bevel portion of wafer W, second nozzle 250 also corresponds to the chemical liquid nozzle of the present exemplary embodiment.

Figure 12:
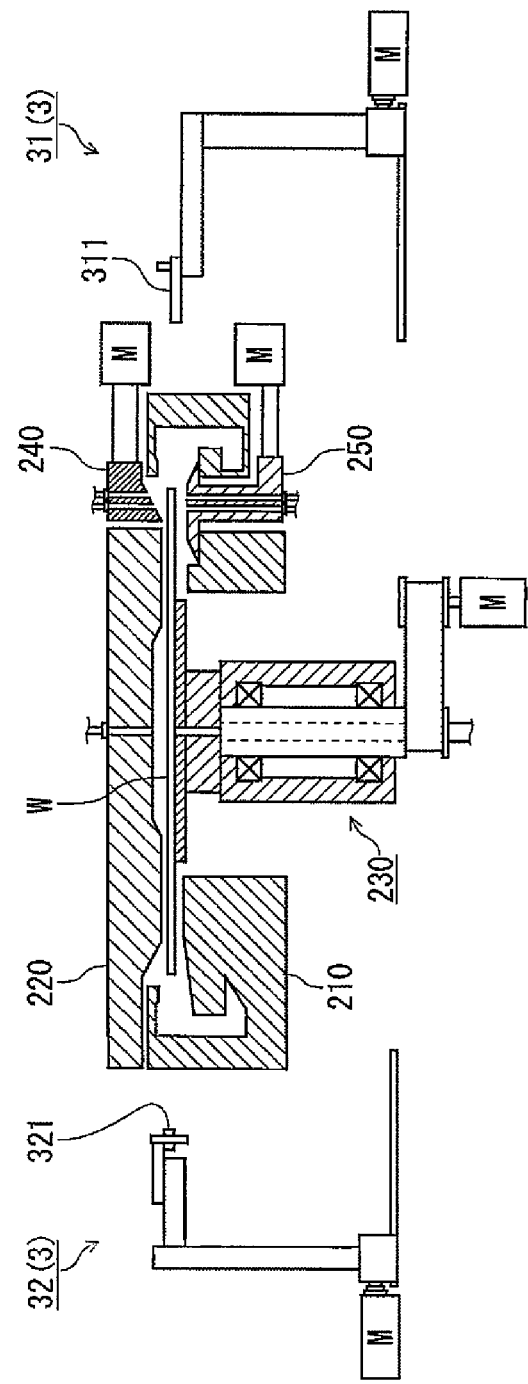
FIG. 12 is a longitudinal cross-sectional view of the wafer processing apparatus at the time of processing a wafer.

Top plate 220 and drain cup 210 as described above are provided with a lifting/lowering mechanism which is not illustrated in the drawings. When wafer W is placed on wafer holding unit 230, top plate 220 is retreated upward, and drain cup 210 is retreated downward. In addition, when the processing of the bevel portion is performed, top plate 220 and drain cup 210 are moved from the retreated positions to the processing positions thereof to be overlapped with each other as illustrated in FIG. 12, thereby forming a processing space where the processing of wafer W is performed.

In addition, the wafer processing apparatus includes a positioning mechanism 3 to align the center of rotation of wafer holding unit 230 and the center of wafer W. Positioning mechanism 3 includes a first positioning mechanism section 31 where a first positioning member 311 is provided to come into contact with the side circumferential surface of wafer W; and a second positioning mechanism section 32 where a second positioning member 321 is provided to come into contact with the side circumferential surface of wafer W. Second positioning member 321 is positioned opposite to the first positioning member 311 with reference to the center of rotation of wafer holding unit 230.

Figure 4:
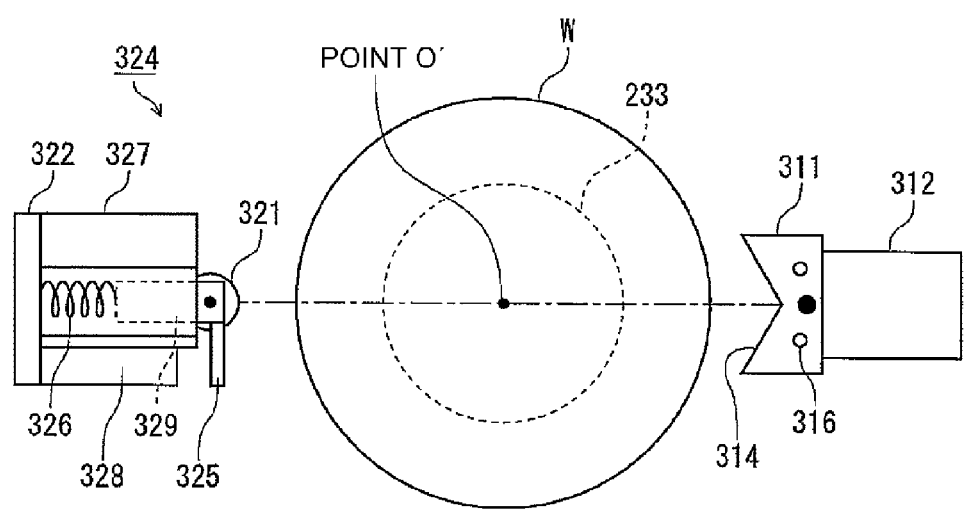
FIG. 4 is an explanatory view of a positioning mechanism provided in the wafer processing apparatus.

As illustrated in FIG. 4, first positioning member 311 is a member that has a V-shaped cut-out portion when viewed from the top side thereof. First positioning member 311 comes into contact with two points on the side circumferential surface of wafer W on contact surfaces 314 which are the side walls in the cut-out portion.

As illustrated in FIG. 3, the first positioning member 311 is connected to a first driving unit 313 through a support unit 312 which is configured to be movable on a rail 312a. First driving unit 313 is configured such that first driving unit 313 may linearly move first positioning member 311 in the directions of getting close to and away from the center of rotation of wafer holding unit 230, and may stop first positioning member 311 at a desired position. First driving unit 313 may include, for example, an extendible/retractable rod, or a stepping motor that may extend or retract the extendible/retractable rod to a relatively correct length.

Second positioning member 321 illustrated in FIGS. 3 and 4 is a member that is retained rotatable about a central axis thereof. Second positioning member 321 is arranged in such a manner that its central axis is retained in the vertical direction to allow the cylindrical side circumferential surface of second positioning member 321 to come into contact with the side circumferential surface of wafer W. As a result, even if the center of wafer W is positioned out of a straight line connecting the center of rotation of wafer holding unit 230 and second positioning member 321 when second positioning member 321 comes into contact with the side circumferential surface of wafer W, second positioning member 321 is rotated in conformity with the movement of wafer W. Accordingly, wafer W may be smoothly moved.

As illustrated in FIG. 3, second positioning member 321 is supported by a support unit 322 through a wafer diameter measuring mechanism 324. Support unit 322 is configured to be movable on a rail 322a. Wafer diameter measuring mechanism 324 will be described later. Support unit 322 is provided with a second driving unit 323 at the base end thereof. Second driving unit 323 may move second positioning member 321 in the directions of getting close to and away from the center of rotation of wafer holding unit 230 on an extension line of a straight line connecting the direction of moving first positioning member 311 and the center of rotation of wafer holding unit 230, and may stop second positioning member 321 at a desired position. Second driving unit 323 may include, for example, an extendible/retractable rod, or a stepping motor that may extend or retract the extendible/retractable rod to a relatively correct length.

With the above-mentioned construction, as illustrated in FIG. 4, first positioning member 311 and second positioning member 321 arranged opposite to each other with reference to the center of rotation (O' point) of wafer holding unit 230 are movable on a straight line that extends through the center of rotation. In addition, the center of wafer W may be aligned with the center of rotation by making first positioning member 311 and second positioning member 321 come into contact with the side circumferential surface of wafer W such that wafer W is sandwiched therebetween.

However, since wafer W may have a tolerance, for example, in a range of a diameter ±0.2 mm due to, for example, a manufacturing error, each wafer W has a different distance from the side circumferential surface, which comes into contact with first and second positioning members 311, 321, to the center. Accordingly, for example, second positioning mechanism section 32 of positioning mechanism 3 is provided with measuring mechanism 324 to measure the diameter of wafer W.

As illustrated in FIG. 3, measuring mechanism 324 is supported by support unit 322 in a state where the front end of measuring mechanism 324 retains second positioning member 321. As illustrated in FIG. 4, measuring mechanism 324 includes: a body 327; a connection unit 329 configured to retain second positioning member 321 at the top side of second positioning member 321 in a state where the front end of connection unit 329 protrudes toward the center of rotation of wafer holding unit 230; a spring unit 326 accommodated within body 327 and interposed between the base end of connection unit 329 and an inner wall of body 327; a movable unit 325 formed by a flat member installed at the front end of connection unit 329 to extend from a position above second positioning member 321 to a side of second positioning member 321; and a position sensor 328 arranged at a position on the side of connection unit 329 to be opposite to a flat surface of movable unit 325. As the position sensor 328, a contact type sensor, or a contactless type sensor, such as a magnetic sensor or an optical sensor, may be used.

Spring unit 326 is biased in a direction to push out connection unit 329 toward the center of rotation of wafer holding unit 230, and second positioning member 321 extends toward the center of wafer W beyond the side circumferential surface of wafer W. In addition, a positioning wafer, which is precisely machined to have a diameter of 300 mm, is held on wafer holding unit 230 in such a manner that the center of positioning wafer W is aligned with the center of rotation of wafer holding unit 230 (the center of rotation shaft 235).

In addition, when second positioning member 321 is made to come into contact with the side circumferential surface of positioning wafer W in a state where the side circumferential surface of positioning wafer W is in contact with two contact surfaces 314 of first positioning member 311, connection unit 329 pushed out by spring unit 326 is returned to its original position. Following the movement of connection unit 329, movable unit 325 is moved and position sensor 328 detects the distance to movable unit 325.

Accordingly, an extension width of the extendible/retractable rod of first driving unit 313 when first positioning member 311 is in contact with positioning wafer W, and an extension width of the extendible/retractable rod of second driving unit 323, for example, when second positioning member 321 is arranged at a position where the distance from position sensor 328 to movable unit 325 is 1 mm are stored in a controller 5 to be described later.

Then, when a real wafer W is processed, first and second positioning members 311, 321 are moved to the positions stored in advance using the above-mentioned positioning wafer W, respectively. In that event, when the distance from position sensor 328 to movable unit 325 is, for example, 1.1 mm which is larger than 1 mm, it can be found that the diameter of wafer W is 299.9 mm which is smaller than 300 mm. In addition, when the distance from position sensor 328 to movable unit 325 is 0.9 mm which is less than 1 mm, it can be found that the diameter of wafer W is 300.1 mm which is larger than 300 mm.

Measuring mechanism 324 measures the diameter of wafer W with the above-mentioned principle, and the positioning of first and second positioning mechanism sections 31, 32 is completed by moving wafer W such that the central position of the diameter of wafer W measured by measuring mechanism 324 is aligned with the center of rotation. The positioning as described above is performed in a state where wafer W is floated by ejecting nitrogen gas from gas flow path 234.

In addition, moving mechanisms 241, 251 of first and second nozzles 240, 250 move nozzles 240, 250 to central side positions by a predetermined distance from the peripheral edge of each wafer W, respectively, based on the position of the peripheral edge of each wafer W that is determined based on the diameter measured by measuring mechanism 324, and processing liquids are supplied from those positions, respectively. As a result, even if the diameter of wafer W is changed within a tolerance range, each of the nozzles 240, 250 is capable of removing the film on the bevel portion by a predetermined removed width (hereinafter, referred to as a "cut width") from the peripheral edge of wafer W.

Figure 5:
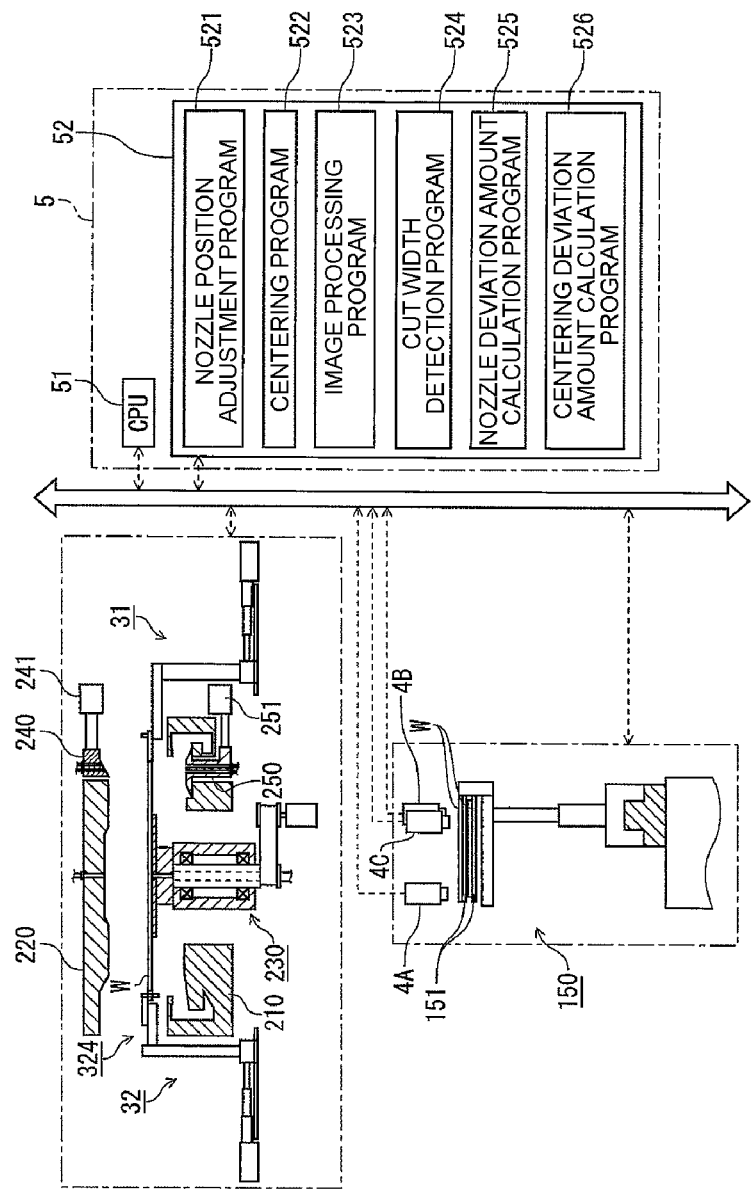
FIG. 5 is a block diagram illustrating an electric structure of the wafer processing apparatus.

In addition, as illustrated in the block diagram of FIG. 5, individual equipments and wafer processing apparatuses provided in the wafer processing system of the present exemplary embodiment are connected to controller 5. Controller 5 is configured by a computer that includes a CPU 51 and a storage unit 52. The storage unit 52 is recorded with a program, in which the operations of controller 5, i.e., a group of steps (commands) for controls related to actions of: carrying wafer W into the wafer processing system; transporting wafer W to the wafer processing apparatus within wafer processing units 171, 172, 173, 174; performing position alignment by positioning mechanism 3; lowering and lifting top plate 220 and drain cup 210 to form a processing space; performing a liquid processing of the bevel portion of wafer W; and carrying wafer W out from the wafer processing system are programmed. The program may be stored in a storage medium, such as for example, a hard disc, a compact disc, a magnet optical disc, and a memory card, and may be installed in the computer from the storage medium.

Here, the steps related to the actions concerning the position alignment of the center of wafer W using positioning mechanism 3 or measuring mechanism 324 (hereinafter, to be referred to as "centering") or the position adjustment of first and second nozzles 240, 250 based on the result of measuring the diameter of wafer W may be programmed in a centering program 522 and a nozzle position adjusting program 521, respectively. In this viewpoint, it may be said that controller 5 has functions of a positioning controller and a nozzle controller of the wafer processing apparatus.

As described above, the wafer processing apparatus of the present exemplary embodiment includes positioning mechanism 3 and diameter measuring mechanism 324 of wafer W, and processing liquid supply positions are adjusted in a state where the center of wafer W and the center of rotation of wafer holing unit 230 are aligned with each other by these mechanisms 3, 324.

The positions of moving mechanisms 241, 251 of first and second nozzles 240, 250, and driving units 313, 323 of first and second positioning members 311, 321 are controlled using, for example, stepping motors. However, under the influence of, for example, expansion, extension or retraction of an equipment according to the fluctuation of environmental temperature, or a pulse deviation of a stepping motor, the positional deviation or centering deviation of first and second nozzles 240, 250 may gradually occur.

A positional deviation caused by moving mechanisms 241, 251 of such nozzles 240, 250 or driving units 313, 323 of positioning members 311, 321 is difficult to measure using positioning mechanism 3 or measuring mechanism 324. Meanwhile, in a recent liquid processing of a bevel portion, it is sometimes requested that the degree of precision for a liquid processing finished cut width be improved to such an extent that the cut width does not to exceed, for example, ±100 μm for a predetermined distance.

Accordingly, the wafer processing apparatus of the present exemplary embodiment has functions of determining the positional deviation of first and second nozzles 240, 250 and the centering deviation of wafer W by capturing image of the condition of the liquid processing finished bevel portion, using CCD (Charge-Coupled Device) cameras 4A, 4B, 4C, and measuring the cut width based on the result of image capturing. Hereinbelow, descriptions will be made as to a method of determining each of the deviations using CCD cameras 4A, 4B, 4C.

Figure 2:
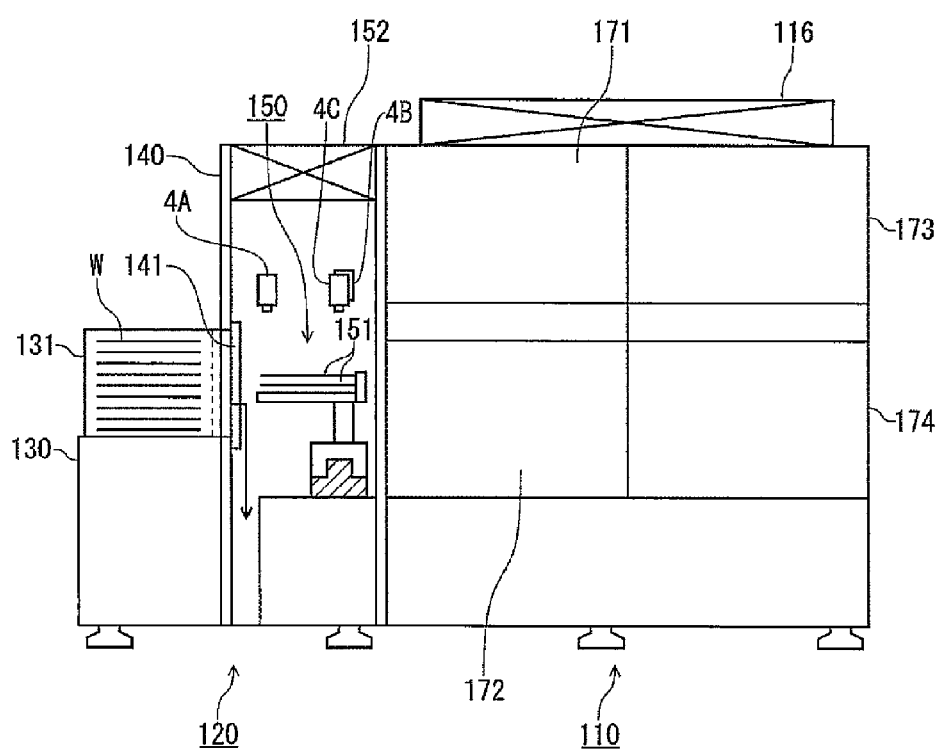
FIG. 2 is a side view of the wafer processing system.

The wafer processing apparatus of the present exemplary embodiment is provided with three CCD cameras 4A, 4B, 4C in the space of transportation chamber 140 that forms a transportation path of wafer W from FOUPs 131 to each wafer processing apparatus. The CCD cameras may be common to a plurality of wafer processing apparatuses. As illustrated in FIGS. 1 and 2, CCD cameras 4A, 4B, 4C are arranged at a position where the cameras do not interfere with a track in which first wafer transportation mechanism 150 transports wafer W between FOUPs 131 and wafer transfer unit 114, for example, at a position adjacent to the right side wall of transportation chamber 140 and higher than the openings of FOUPs 131 when viewed from the placement table 130.

Figure 6:
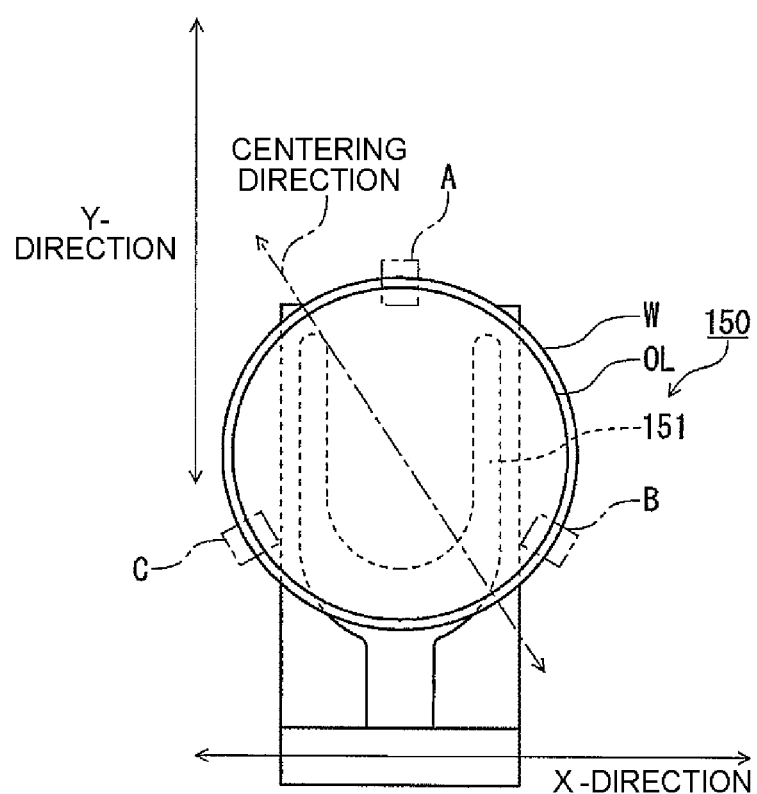
FIG. 6 is an explanatory view illustrating the positions of image capture areas set on a wafer.

CCD cameras 4A, 4B, 4C are arranged in a state where the lenses thereof are directed downward. As illustrated in FIGS. 5 and 6, wafer W held on pick 151 of first wafer transportation mechanism 150 is located at an image capture position which is spaced apart from the lenses of CCD 4A, 4B, 4C by a focal distance such that the capturing of the image of liquid processing finished wafer W may be performed. CCD cameras 4A, 4B, 4C correspond to an image capture unit of the present exemplary embodiment.

For each of CCD cameras 4A, 4B, 4C of the present exemplary embodiment, for example, a 2.0 mega pixel camera may be used. The 2.0 mega pixel camera may capture an image of a field of view of 5 mm×5 mm using a 1:1 magnification lens so as to capture an image of a subject with a resolution of 10 μm or less. In addition, an illumination (not illustrated) may be arranged adjacent to CCD cameras 4A, 4B, 4C, and the bevel portion of wafer W, which is the subject, may be illuminated using the illumination.

Meanwhile, as illustrated in FIG. 6, each of CCD cameras 4A, 4B, 4C captures an image of wafer W when pick 151 holding liquid processing finished wafer W is moved to a predetermined position. In addition, images of the three positions to be captured by CCD cameras 4A, 4B, 4C are set as image capture areas A, B, C, respectively.

The wafer processing apparatus of the present exemplary embodiment is configured such that the capturing of an image is performed in relation to the bevel portion of wafer W held on upper side pick 151 among picks 151 which are arranged vertically in two stages. However, for example, after the capturing of the image of wafer W held on upper side pick 151 is finished, and then the corresponding wafer W is accommodated in FOUP 131, the capturing of the image of the bevel portion of wafer W held on lower side pick 151 may be performed. Of course, the capturing of the image of all wafers W may be performed using a wafer transportation mechanism 150 including only one pick 151.

Here, when the rotation of wafer W is stopped, the above-described wafer holding unit 230, for example, vacuum chuck unit 233 may allow wafer W to be placed at a position which is the same as the position of wafer W when wafer W was placed on vacuum chuck unit 233 in the rotating direction of wafer W. Accordingly, wafer W may be transferred between wafer holding unit 230 and second wafer transportation mechanism 160 in a state where the position in the rotating direction before and after the liquid processing are equal to each other. This wafer W is held in pick 151 of first wafer transportation mechanism 150 through a placement shelf 114a. Accordingly, wafer W on the corresponding pick 151 is always retained at a position determined in relation to the rotating direction, which makes it possible to correctly perform the capturing of the images of the image capture areas A, B, C of each wafer W.

Figure 7:
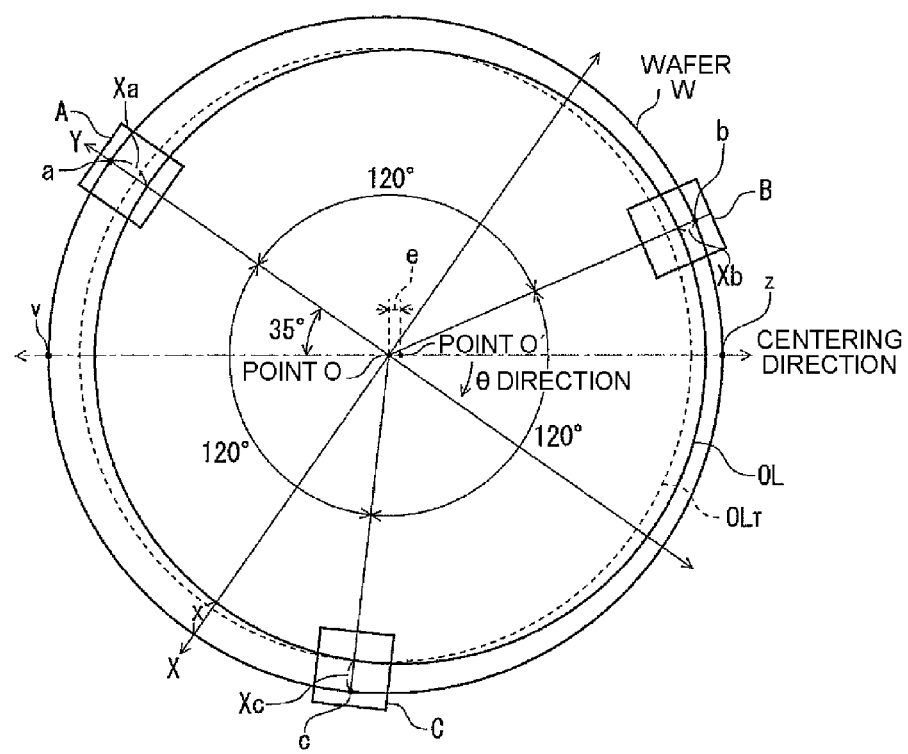
FIG. 7 is an explanatory view illustrating an outline of a cut width in a case where the center of the wafer and the center of rotation are deviated from each other.

FIG. 7 is an explanatory view illustrating a relationship between the setting positions of image capture areas A, B, C on wafer W and a centering direction. In the drawing, a straight line depicted by alternate long and short dash lines is a straight line (a centering straight line) that indicates a direction where first positioning member 311 and second positioning member 321 are opposed to each other with reference to the center of wafer W (point O in the drawing) and the centering is performed. Point v and point z are intersection points between this straight line and the peripheral edge (ends) of wafer W, in which point z is positioned at first positioning member 311 side, and point v is positioned at second positioning member 321 side.

In addition, point a is set at the position moved from point v in the direction of rotating clockwise by 35° along the peripheral edge of wafer W about point O, and point b and point c are set at the positions moved clockwise by 120° and by 240° from point a, respectively. Points a, b, c are measuring points where the measuring of a cut width of a liquid processing finished film is performed.

The setting positions of image capture areas A, B, C are set in such a manner that the above-mentioned measuring points a, b, c on a 300 mm wafer W are arranged at predetermined positions in an image captured by CCD camera. In addition, the X-direction and Y-direction illustrated in FIG. 7 correspond to the moving directions of pick 151 illustrated in FIG. 6.

In relation to wafer W having the measuring points, each of which is set as described above, descriptions will be made as to how to determine a deviation amount of first nozzle 240 and a centering deviation amount of wafer W. Here, as illustrated, for example, in FIG. 2, CCD cameras 4A, 4B, 4C of the present exemplary embodiment are arranged to capture an image of the bevel portion of wafer W from the top side of wafer W. Accordingly, the positional deviation amount of first nozzle 240 that supplies a processing liquid to the corresponding top side of wafer W may be determined.

First, descriptions will be made as to how to determine the deviation amount of first nozzle 240. Here, it is assumed that the arrangement of first nozzle 240 is aimed at etching the bevel portion with a cut width of x mm from the peripheral edge of wafer W. In FIG. 7, a solid line OL indicates an outline of the film that is not cut by etching when wafer W is placed on wafer holing unit 230 in a state where wafer W is deviated from the center of wafer W (point O) to point z side in the centering direction by a deviation amount e. In such a case, the liquid processing is performed while wafer W is being rotated about point O'.

Meanwhile, a dotted line $OL_T$ in FIG. 7 indicates an outline of a film that is targeted when the center of wafer W (point O) and the center of rotation are aligned with each other. In addition, for the convenience of description, the deviation width between two outlines OL, $OL_T$ are exaggeratedly illustrated out of proportion in FIG. 7.

When the deviation direction of the center of rotation (point O') from the center of wafer W (point O) is aligned with the centering direction, the cut width between outline OL and the peripheral edge of wafer W is the smallest at point z on the centering straight line, and is the largest at point v. For example, assuming that the average measured cut width value is x' (=x+Δx) that includes a deviation Δx from the target position of first nozzle 240, the cut width value $x_z$ actually removed at point z will be "x'−e" and the cut width value $x_v$ actually removed at point v will be "x'+e." Δx will be a first difference in the present disclosure.

The cut width at a position other than point z and point v may be expressed as Equation 1 below.

$$x(\theta)=(x'-e)+e(1-\cos\theta) \quad (1)$$

Here, θ is a clockwise rotational angle about point O from point z.

Figure 8:
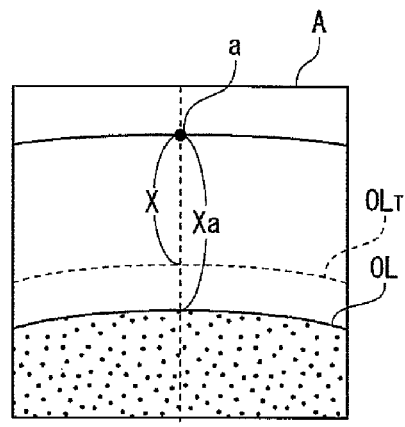
FIG. 8 is an enlarged view illustrating the cut width at the image capture area A.
Figure 9:
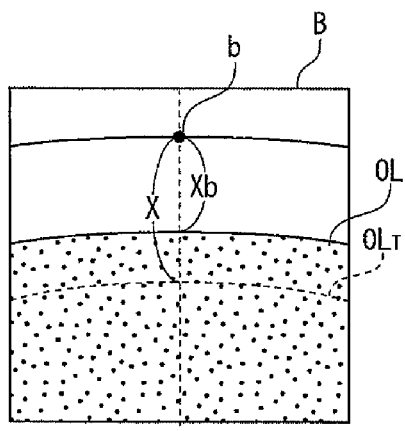
FIG. 9 is an enlarged view illustrating the cut width at the image capture area B.
Figure 10:
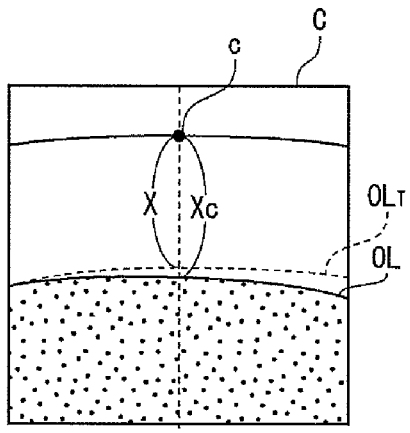
FIG. 10 is an enlarged view illustrating the cut width at the image capture area C.

When image of the etched state of the bevel portion is captured at image capture areas A, B, C, images of the different cut widths $x_a$, $x_b$, $x_c$ as illustrated in FIGS. 8 to 10 are captured. Accordingly, the ends (peripheral edge) and outline OL of wafer W may be determined based on, for example, tone transition of individual pixels.

In addition, a straight line is drawn out in a radial direction of wafer W from each of points a, b, c which are preset in image capture areas A, B, C, respectively (such straight lines are depicted by dotted lines in FIGS. 8 to 10). Then, the distances $x_a$, $x_b$, $x_c$ from points a, b, c to points of intersection between the straight lines and the outline OL are calculated, respectively. These distances may be determined based on, for example the number of pixels on the radial straight lines. Calculated $x_a$, $x_b$, $x_c$ are actually removed values for the cut width. Although the diameter of wafer W is changed in fact within a tolerance range as described above, it may be desirable if the points of intersection between the outline of wafer W determined through the above-described image processing, and the radial straight lines are determined as points a, b, c.

Meanwhile, points a, b, c are arranged at the positions rotated by 215° (point a), 335° (point b), and 95° (point c) from point z, respectively, as illustrated in FIG. 7. Accordingly, from Equation 1 above, $x_a$, $x_b$, $x_c$ may be expressed as follows.

$$x_a = x'(215°) = (x'-e) + e(1-\cos 215°) \quad (2)$$

$$x_b = x'(335°) = (x'-e) + e(1-\cos 335°) \quad (3)$$

$$x_c = x'(95°) = (x'-e) + e(1-\cos 95°) \quad (4)$$

In addition, the sum of cosine values of angles obtained by dividing a circle into three equal parts in the circumferential direction (in the present exemplary embodiment, "cos 215°+cos 335°+cos 95°") equals to 0. Accordingly, when both sides of Equations 2 to 4 are combined and arranged, deviation amount e is eliminated and Equation 5 below is obtained $$x' = (x_a + x_b + x_c)/3 \quad (5)$$

As a result, from $\Delta x = x'-x$, the positional deviation amount of first nozzle 240 is determined.

Here, the number of image capture areas needed for determining the deviation amount of first nozzle 240 is not limited to three. The images of the peripheral edge of wafer W may be captured at n places (n is natural number not less than 2) equally spaced in the circumferential direction. Based on the actually removed values of cut widths at the positions determined at an equal interval (division points), the same calculation as the above-mentioned example may be performed. In such a case, n image capture areas are set at the positions each of which includes a division point.

Next, descriptions will be described as to how to determine the centering deviation amount e. By calculating Equation 2 above, Equation 6 below is obtained, and deviation amount e can be calculated.

$$e = (x_a - x')/(-\cos 215°) \quad (6)$$

$$= \{x_a - (x + \Delta x)\}/0.18$$

When e has a plus (+) value, the center of rotation (point O') is deviated in the right direction from the center of wafer W (point O), and when e has a minus (−) value, the center of rotation (point O') is deviated in the left direction. Deviation amount e determined by this method corresponds to the second difference in the present disclosure.

In storage unit 52 of controller 5 of the wafer processing apparatus of the present exemplary embodiment, there are stored an image processing program 523 configured to detect the peripheral edge or outline OL of wafer W based on the result of the image capturing by the above-described CCD cameras 4A, 4B, 4C, a cut width detection program 524 configured to calculate the actually removed values $x_a$, $x_b$, $x_c$ of cut widths of a bevel portion based on the result of the image processing, a nozzle deviation amount calculation program 525 configured to calculate the deviation amount of first nozzle 240, $\Delta x$, based on the result of detecting the cut widths, a centering deviation amount calculation program 526 configured to calculate centering deviation amount e by positioning mechanism 3. In addition, in these programs 523, 524, 525, 526, the steps of determining each deviation amount using the above-mentioned method, comparing the deviation amount with a predetermined permissible difference (for example, there is set a value where the sum of nozzle deviation amount $\Delta x$ and centering deviation value e does not exceed ±100 μm), and determining whether a cut width by liquid processing is suitable or not are programmed. From this viewpoint, it may be said that controller 5 corresponds to a determination unit of the present disclosure.

Figure 11:
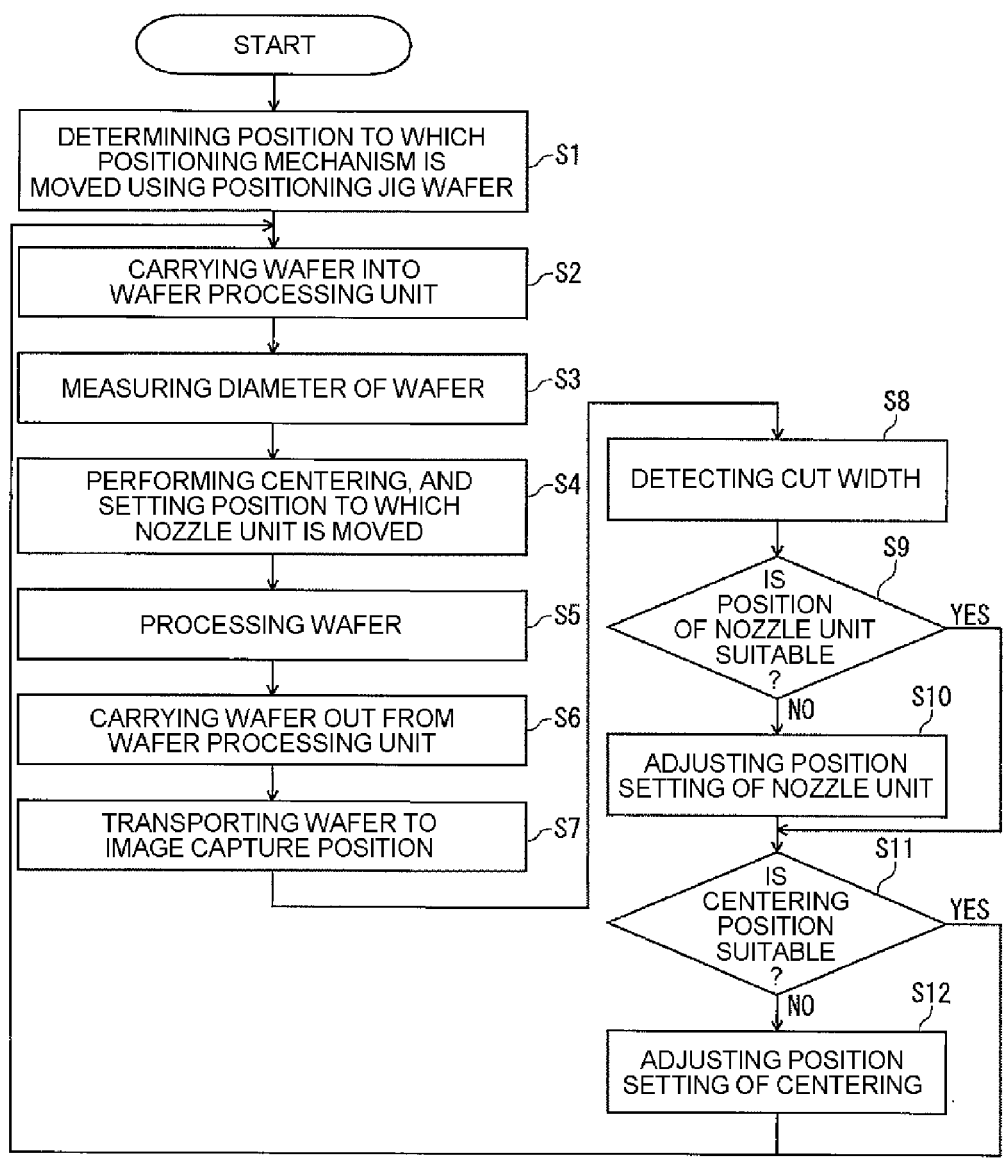
FIG. 11 is a flowchart illustrating the flow of operations of the wafer processing apparatus.

Hereinbelow, the operations of the above-described wafer processing apparatus will be described with reference to the flowchart of FIG. 11. First, prior to initiating a processing of real wafer W, a position to move positioning mechanism 3 is determined using a positioning jig wafer W, and the corresponding position data is stored (step S1).

After the position to move positioning mechanism 3 is determined, positioning jig wafer W is removed. Then, an FOUP 131 that accommodates a wafer W to be processed is placed on placement table 130, and is connected to transportation chamber 140. Then, wafer W is taken out and placed on placement shelf 114a of wafer transfer unit 114 by first wafer transportation mechanism 150.

Second wafer transportation mechanism 160 takes out wafer W to be processed from placement shelf 114a, and carries wafer W into a wafer processing unit where no liquid processing is performed (step S2). In each of wafer processing units 171, 172, 173, 174, the wafer processing apparatus is standing by in a state where top plate 220 and drain cup 210 are retreated upward and downward as illustrated in FIG. 3. Second wafer transportation mechanism 160 transfers wafer W to vacuum chuck unit 233 of wafer holding unit 230, and then retreat from the corresponding wafer processing unit 171, 172, 173, 174.

After wafer W is transferred to wafer holding unit 230, positioning mechanism 3 is moved to the previously stored position in a state where wafer W is floated by supplying nitrogen gas through gas flow path 234, and then the diameter of wafer W is measured (step S3). Then, based on the measured diameter, the centering of wafer W is performed, and a setting of position data to move first and second nozzles 240, 250 is performed such that the etching of the bevel portion is performed by a predetermined cut width (step S4).

After the centering of wafer W and the setting of position data of first and second nozzles 240, 250 are performed, wafer W is adsorptively held on vacuum chuck unit 233, and first and second positioning mechanism sections 31, 32 are retreated. Then, top plate 220 and drain cup 210 are lowered and lifted to the processing positions thereof, respectively, thereby forming a processing space. In that event, first and second nozzles 240, 250 are retreated to the outside of wafer W (FIG. 12).

Then, a gas is supplied through gas supply line 222 of top plate 220, and wafer W on wafer holding unit 230 is rotated at a predetermined rotating speed. In addition, the first and second nozzles 240, 250 are moved to the predetermined positions thereof while ejecting an etching processing liquid, which is a chemical liquid.

As the etching processing liquid, for example, hydrofluoric acid (HF), a mixture of ammonia ($NH_3$) and hydrogen peroxide (H₂O₂), and fluonitric (a mixture of hydrofluoric acid and nitric acid (HNO₃)) may be used.

After arriving at the predetermined positions thereof, first and second nozzles 240, 250 supply the etching processing liquid to the bevel portion from the top and bottom sides of wafer W for a predetermined length of time to perform the removal of unnecessary film from the corresponding portions (step S5).

Thereafter, the processing liquid supplied from the first and second nozzles 240, 250 are switched to a rinse liquid, DIW, to perform the rinsing processing of the bevel portion. When the rinsing processing has been performed for a predetermined length of time, the supply of DIW is stopped, and the rotation of wafer W is continued so as to perform the spin drying of DIW.

After finishing the spin drying, the rotation of wafer W is stopped. After top plate 220 and drain cup 210 are retreated upward and downward, respectively, the adsorptive holding by vacuum chuck unit 233 is released. In addition, second wafer transportation mechanism 160 enters the corresponding wafer processing unit 171, 172, 173, 174 and receives and carries wafer W out from the wafer processing unit (step S6).

After the liquid processing is finished, wafer W is transferred in the sequence of: second wafer transportation mechanism 160, wafer transfer unit 114, and first wafer transportation mechanism 150. The sequence is reversed from that performed at the time of carrying-in wafer W. In addition, the first wafer transportation mechanism 150, which holds liquid processing finished wafer W on pick 151, moves the pick to image capture positions below CCD cameras 4A, 4B, 4C (step S7). Then, images of the image capture areas A, B, C are captured, the cut width of the bevel portion is detected from the result of the image capturing (step S8), and then the corresponding wafer W is accommodated in FOUP 131.

Meanwhile, controller 5 determines which is wafer processing unit 171, 172, 173, 174 whose wafer processing apparatus has processed cut width detected wafer W. In addition, based on the result of detecting the cut width at the above-mentioned measuring points a, b and c, controller 5 determines whether an etching processing liquid supplying position is suitable or not (in the present exemplary embodiment, whether positional deviation amount Δx of first nozzle 240 is a value within the predetermined permissible difference or not) (step S9).

When it is determined as being suitable (step S9: YES), controller 5 proceeds to the next determining step, and when it is determined as being unsuitable, the position setting of first nozzle 240 is adjusted by nozzle position adjusting program 521 (step S10). For example, when the cut width was set as x and the positional deviation amount was Δx, an adjustment to set the cut width as x−Δx is performed so as to remove the positional deviation amount.

After these steps, it is determined whether the centering has been suitably performed or not (in the present exemplary embodiment, whether deviation amount e between the center of wafer W and the center of rotation is a value within the predetermined tolerance range or not) (step S11).

When it is determined as being suitable, next wafer W is carried into the wafer processing apparatus where cut width detected wafer W was processed (step S11: YES). At this time, the deviation in centering may be determined from the fact that the cut widths at measuring points a, b, c are varied. Accordingly, when the variation is within a range of predetermined values, the load of controller 5 may be retrieved by determining that centering is suitably performed without calculating centering deviation amount e.

Meanwhile, when it is determined that centering is not performed suitably, the setting of positioning mechanism 3 is adjusted by centering program 522 (step S12). For example, the positions, to which first and second positioning mechanism sections 31, 32 are moved, may be corrected to the positions where the deviation amount e may be removed.

In addition, after the corresponding setting is finished, wafer processing apparatus stands by until next wafer W is carried therein.

According to the wafer processing apparatus of the present exemplary embodiment, following effects can be obtained. Based on the result of the image-capturing obtained by capturing image of the bevel portion of liquid-processed wafer W, it is determined whether the cut width of an unnecessary film by an etching processing liquid supplied from first nozzle 240 is suitable or not. In addition, when the cut width is unsuitable, the positional setting of first nozzle 240 is corrected in the direction of removing the positional deviation amount of first nozzle 240. As a result, the liquid processing of the bevel portion may always be performed with high precision.

In addition, the centering deviation amount is determined using the image capturing result obtained by capturing image of the bevel portion of the liquid-processed wafer W. Further, the positional setting of positioning mechanism 3 is corrected in the direction of removing the detected deviation amount. As a result, the center of wafer W and the center of rotation may be aligned, and the liquid processing of the bevel portion may always be performed with high precision.

Here, the detection and correction of a cut width using CCD cameras 4A, 4B, 4C may not be performed for all wafers w transported by first wafer transportation mechanism 150. For example, the detection and correction may be performed each time when a liquid processing is performed for a predetermined number of wafers W in each wafer processing apparatus.

In addition, instead of installing three CCD cameras 4A, 4B, 4C at the positions corresponding to image capture areas A, B, C, liquid-processed wafer W may be moved to the image capture position of one CCD camera such that the photographing of image capture areas A, B, C is performed in sequence.

In the present exemplary embodiment, CCD cameras 4A, 4B, 4C are arranged on the transportation path of wafer W that is spaced away from the processing space formed between top plate 220 and drain cup 210 in order to save the space and to prevent CCD cameras 4A, 4B, 4C from being exposed to the etching liquid. In contrast, for example, a part or the entirety of top plate 220 may be formed by a transparent member, and a CCD camera may be arranged above the transparent member such that capturing of an image may be performed in a state where wafer W is placed in the processing space.

In addition to the above, the wafer processing apparatus may perform only the determination as to whether the positional or centering deviation amount of first nozzle 240 based on the capturing result by CCD cameras 4A, 4B, 4C, and may not perform the correction thereof. For example, the wafer processing apparatus may only give the alarm indicating that the deviation amount of the cut width is increased due to the positional deviation of first nozzle 240, and the position of first nozzle 240 may be manually corrected. In addition, in a wafer processing apparatus that does not use positioning mechanism 3, the positional deviation amount of centering may be output to the controller of second wafer transportation mechanism 160, and the centering position may be corrected by adjusting the transmitting position of wafer W from corresponding wafer transportation mechanism 160 to wafer holding unit 230.

Further, the wafer processing apparatus may determined any one of the deviation amount of the cut width due to the positional deviation of first nozzle 240, and the deviation amount of the cut width due to the positional deviation of centering. Moreover, the capturing of the image of the cut width using CCD cameras 4 is not limited to a case where the capturing of the image is performed by the wafer processing apparatus, and a determination may be made by a stand-alone apparatus after wafer W is transported from the wafer processing system to FOUP 131.

The films to be removed are not limited to an $SiO_2$ film, an SiN film, and polysilicon film, but may include a resist film.

In addition to the detection of these cut widths, for the image capture result of the bevel portion, other determinations, for example, a determination of lack of etching or a determination of the thickness of a cut film, for example when a film on the peripheral edge of wafer is cut in a step shape may also be concurrently performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing system comprising:
a substrate processing unit; a carry-in, carry-out unit; and a controller;
wherein the substrate processing unit comprises:
a substrate holding unit configured to hold a substrate horizontally and rotate the substrate about a vertical axis;
a substrate positioning mechanism including a contact member that contacts a bevel portion of the substrate configured to move the substrate on the substrate holding unit to determine a position of the substrate on the substrate holding unit;
a chemical liquid nozzle configured to supply a chemical liquid to the bevel portion of the substrate rotated by the substrate holding unit in order to remove a film of the bevel portion of the substrate; and
a nozzle moving mechanism including a motor configured to move the chemical liquid nozzle on the substrate holding unit;
wherein the carry-in, carry-out unit comprises:
a placement table for receiving and storing at least one substrate carrier; and
a transportation chamber, in which is installed an image capture unit including a camera lens configured to capture images of a plurality of image capture areas existing on the bevel portion of the substrate where the film of the bevel portion of the substrate is removed by the chemical liquid, the image capture unit capturing images when the substrate is moved from the substrate processing unit to a predetermined position in the transportation chamber;
wherein the controller comprises a processor configured to control: an overall operation of the substrate holding unit, the positioning mechanism, the chemical liquid nozzle, the moving mechanism, and the image capture unit, and
wherein the controller is programmed to:
calculate a width of the film of the bevel portion of the substrate removed by the chemical liquid for each of the plurality of image capture areas based on the images of the plurality of image capture areas captured by the image capture unit after the film of the bevel portion of the substrate is removed by the chemical liquid thereby obtaining a plurality of widths of the film for each of the plurality of image capture areas;
calculate an average width of the film of the bevel portion of the substrate removed by the chemical liquid based on the plurality of widths of the film for each of the plurality of image capture areas;
compare the average width of the film of the bevel portion of the substrate removed by the chemical liquid with a predetermined width of a film to be removed for a next substrate to be processed later thereby calculating a first difference between the average width of the film of the bevel portion of the substrate removed by the chemical liquid and the predetermined width of the film to be removed for the next substrate to be processed later;
when it is determined that the first difference exceeds a first predetermined permissible value, operate the nozzle moving mechanism to move the chemical liquid nozzle to a position where the first difference becomes smaller than the first predetermined permissible value thereby selectively and automatically adjusting the position of the chemical liquid nozzle for the next substrate to be processed later;
compare each of the plurality of widths of the film of the bevel portion of the substrate removed by the chemical liquid for each of the plurality of image capture areas with the predetermined width of the film to be removed for the next substrate to be processed later thereby calculating a second difference between each of the plurality of widths of the film of the bevel portion of the substrate removed by the chemical liquid for each of the plurality of image capture areas and the predetermined width of the film to be removed for the next substrate to be processed later;
when it is determined that the second difference exceeds a second predetermined permissible value, operate the substrate positioning mechanism to move the substrate to a position where the second difference becomes smaller than the second predetermined permissible value thereby selectively and automatically adjusting the position of the substrate; and
after selectively and automatically adjusting the positions of the chemical liquid nozzle and the substrate, introduce the next substrate such that the next substrate is held on the substrate holding unit for a processing with an adjusted position as compared with a position of the substrate processed earlier than the next substrate.

2. The substrate processing system of claim 1, wherein an outline of an image in an image capture area on the bevel portion of the substrate captured by the image capture unit is determined based on a tone transition of individual pixels in the image.

3. The substrate processing system of claim 1,
wherein the transportation chamber further comprises a transportation mechanism configured to transport the substrate between the carrier and the substrate processing unit, the transportation mechanism being equipped with at least two picks arranged in a vertical direction and each configured to hold a substrate horizontally during transport, and wherein the image capture unit captures the images of the bevel portion of the substrate disposed on a pick arranged in an upper most side of the vertical direction.

4. The substrate processing system of claim 3, wherein the transportation mechanism is further configured to transport the substrate between the substrate processing unit and the transportation chamber following processing by the substrate processing unit, and wherein during processing by the substrate processing unit, the substrate holding unit is configured to rotate the substrate such that upon completion of the processing, the picks will contact a same position of the substrate as was contacted by the picks upon transport from the carrier to the substrate processing unit.

* * * * *